(12) United States Patent
Shen et al.

(10) Patent No.: US 9,107,311 B2
(45) Date of Patent: Aug. 11, 2015

(54) METHOD FOR MANUFACTURING PRINTED CIRCUIT BOARD

(71) Applicants: FuKui Precision Component (Shenzhen) Co., Ltd., Shenzhen (CN); Zhen Ding Technology Co., Ltd., Tayuan, Taoyuan (TW)

(72) Inventors: Fu-Yun Shen, Shenzhen (CN); Zhi-Tian Wang, Shenzhen (CN); Bo Ming, Shenzhen (CN)

(73) Assignees: FuKui Precision Component (Shenzhen) Co., Ltd., Shenzhen (CN); Zhen Ding Technology Co., Ltd., Tayuan, Taoyuan (TW)

( * ) Notice: Subject to any disclaimer, the term of this patent is extended or adjusted under 35 U.S.C. 154(b) by 207 days.

(21) Appl. No.: 13/858,102

(22) Filed: Apr. 8, 2013

(65) Prior Publication Data

US 2014/0054074 A1    Feb. 27, 2014

(30) Foreign Application Priority Data

Aug. 23, 2012    (CN) .......................... 2012 1 03021087

(51) Int. Cl.
| | |
|---|---|
| H05K 1/09 | (2006.01) |
| H05K 3/10 | (2006.01) |
| H05K 3/42 | (2006.01) |
| H05K 3/00 | (2006.01) |
| H05K 3/28 | (2006.01) |

(52) U.S. Cl.
CPC .................. *H05K 1/092* (2013.01); *H05K 3/10* (2013.01); *H05K 3/427* (2013.01); *H05K 3/005* (2013.01); *H05K 3/281* (2013.01); *H05K 2201/0195* (2013.01); *H05K 2201/09036* (2013.01); *H05K 2201/09145* (2013.01); *Y10T 29/49155* (2015.01)

(58) Field of Classification Search
CPC ........... H05K 1/03; H05K 1/115; H05K 3/40; H05K 3/46; H05K 3/403; H01L 21/02; H01L 21/48; H01L 23/34; H01L 23/48; H01L 23/467; H01L 23/498
USPC ............. 174/257, 264; 361/748, 783; 29/829, 29/852; 257/734, 774, 777
See application file for complete search history.

(56) References Cited

U.S. PATENT DOCUMENTS

| | | | |
|---|---|---|---|
| 2003/0011075 A1* | 1/2003 | Ohuchi et al. | ................. 257/774 |
| 2003/0173664 A1* | 9/2003 | Ohuchi et al. | ................. 257/734 |

(Continued)

FOREIGN PATENT DOCUMENTS

| | | |
|---|---|---|
| JP | 2006-202891 A | 8/2006 |
| TW | 456162 B | 9/2001 |
| TW | 200826248 A | 6/2008 |

*Primary Examiner* — Xiaoliang Chen
(74) *Attorney, Agent, or Firm* — Novak Druce Connolly Bove + Quigg LLP

(57) ABSTRACT

A printed circuit board includes a first electrically conductive circuit pattern, a substrate layer, an adhesive sheet, and a second electrically conductive circuit pattern, which are arranged in the above described order. The printed circuit board includes a single layer electrically conductive circuit area. The adhesive sheet defines a first opening spatially corresponding to the single layer electrically conductive circuit area. The adhesive sheet includes a first inner sidewall surrounding the first opening. The second electrically conductive circuit pattern defines a second opening spatially corresponding to the single layer electrically conductive circuit area. The second electrically conductive circuit pattern includes a second inner sidewall surrounding the second opening. The first inner sidewall and the second inner sidewall are not completely coplanar.

4 Claims, 15 Drawing Sheets

(56) References Cited

U.S. PATENT DOCUMENTS

2005/0155792 A1* 7/2005 Ito et al. .................. 174/264
2007/0263370 A1* 11/2007 Niki ........................ 361/783
2010/0095523 A1* 4/2010 Niki ........................ 29/850
2011/0085306 A1* 4/2011 Niki ........................ 361/748
2011/0220399 A1* 9/2011 Niki ........................ 174/258

* cited by examiner

METHOD FOR MANUFACTURING PRINTED CIRCUIT BOARD

BACKGROUND

1. Technical Field

The present disclosure generally relates to printed circuit boards (PCBs), and particularly, relates to a printed circuit board and a method for manufacturing the printed circuit board.

2. Description of Related Art

To accommodate development of miniaturized electronic products with multiple functions, printed circuit boards are widely used.

In a double layer PCB, a portion of the PCB may be a single layer circuit area. In the single layer circuit area, there is only one electrically conductive circuit layer. When the double layer PCB is manufactured, a substrate is obtained by laminating a single side copper clad laminate, an adhesive sheet, and a copper foil sheet. Before laminating, an opening spatially corresponding to the single layer circuit area is defined in the copper foil sheet and the adhesive sheet. Then, in an electroplating process, an electroplating copper layer may be formed on a surface of the single side copper clad laminate exposed from the single layer circuit area. However, a bonding force between the single side copper clad laminate and the electroplating copper layer is poor, and the electroplating copper layer damages easily. The damaged electroplating copper layer has liquid medicine, for example, copper plating liquid medicine, etching liquid medicine, but there is a slow drying process. Therefore, electrically conductive circuit traces adjacent to the single layer circuit area is easily oxidized, and a productivity of the PCB is lower What is needed therefore is a printed circuit board, and a method for manufacturing the printed circuit board to overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

A method for manufacturing a printed circuit board 100 (see FIG. 10) includes the following steps.

Figure 1:
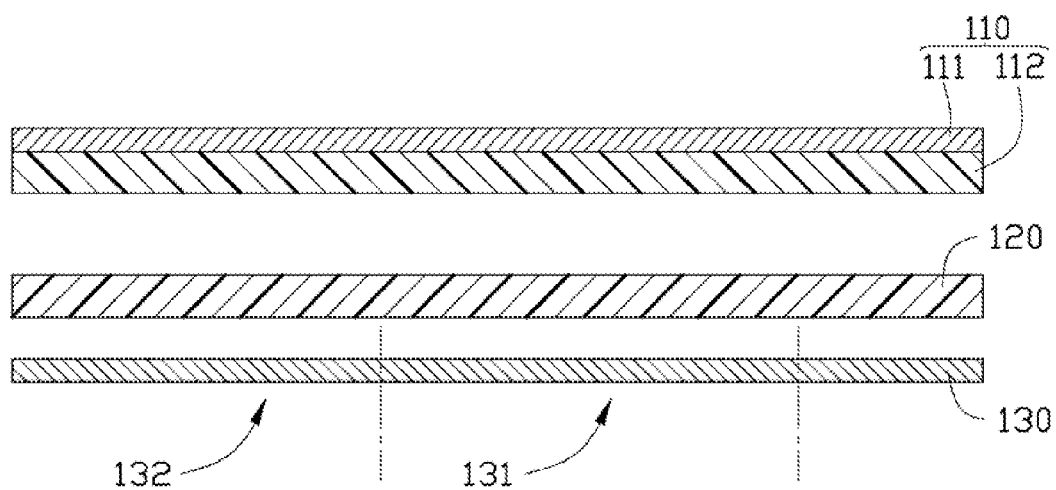
FIG. 1 shows a copper foil substrate, an adhesive sheet, and a copper foil sheet according to an exemplary embodiment.

FIG. 1 shows step 1, in which a single copper foil substrate 110, an adhesive sheet 120 and a copper foil sheet 130 are provided.

The single copper foil substrate 110 includes a copper foil layer 111 and a substrate layer 112. A material of the substrate layer 112 may be polyimide. The adhesive sheet 120 may be a prepreg. The copper foil sheet 130 includes a removable area 131 and a circuit area 132. The removable area 131 will be entirely removed in the following step. A shape of the removable area 131 is identical to a shaped of a single layer circuit area 100b of the printed circuit board 100, and a size of the removable area 131 is identical to a size of the single layer circuit area 100b of the printed circuit board 100. The circuit area 132 surrounds the removable area 131, and the circuit area 132 is configured for manufacturing electrically conductive layer.

Figure 2:
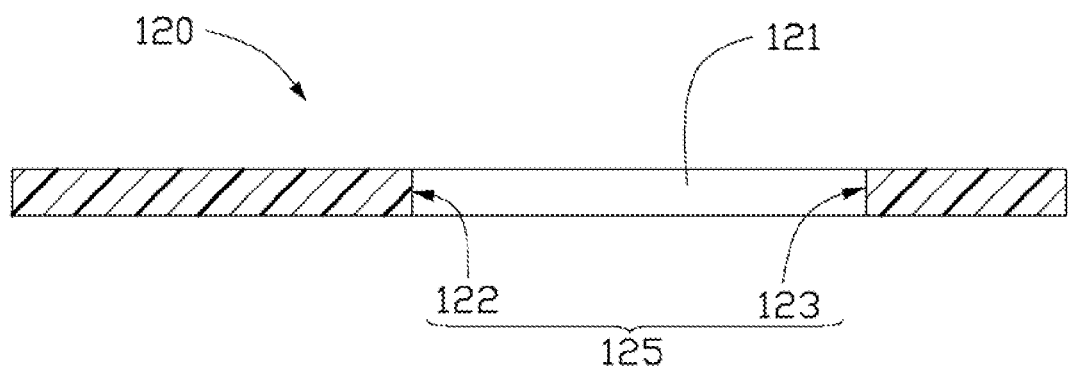
FIG. 2 shows a first opening defined in the adhesive sheet in FIG. 1.
Figure 3:
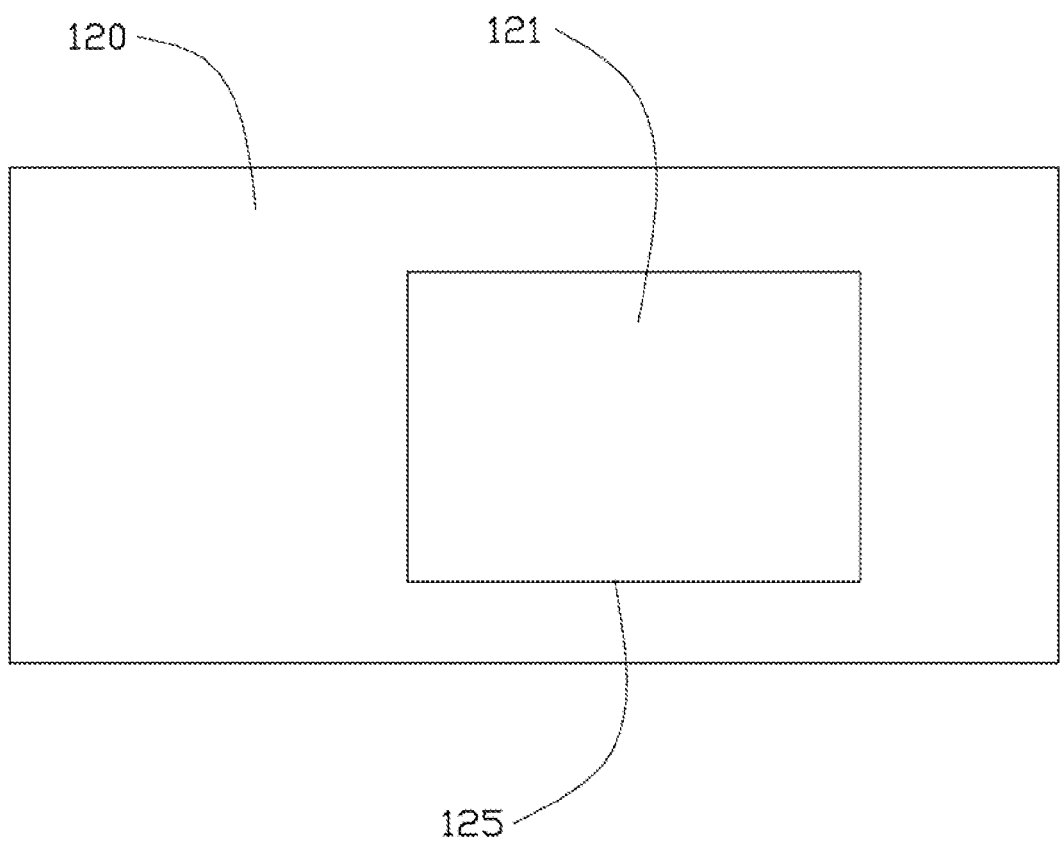
FIG. 3 is a top view of the adhesive sheet having the first opening.

FIGS. 2 and 3 show step 2, in which a first opening 121 is defined. The first opening 121 may be formed by a stamping method. A shape of the first opening 121 is similar to the shaped of the single layer circuit area of the printed circuit board, and a size of the first opening 121 is similar to a size of the single layer circuit area 100b of the printed circuit board 100. In the present embodiment, the shape of the first opening 121 is square. In other embodiments, the shape of the first opening 12 may be polygonal, or round, for example. The adhesive sheet 120 includes a first inner sidewall 125 surrounding the first opening 121. The first inner sidewall 125 includes a first side surface 122, a second side surface (not shown), a third side surface 123, and a fourth side surface (not shown), which are connected end to end.

Figure 4:
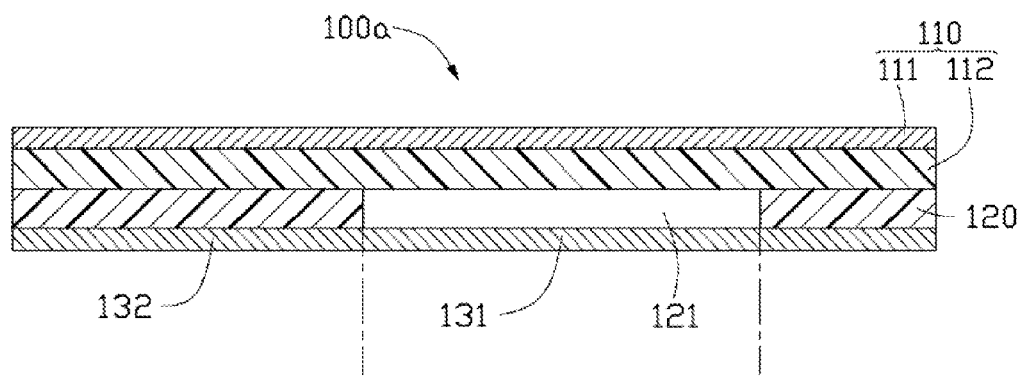
FIG. 4 shows a multilayer substrate including the copper foil substrate of FIG. 1, the copper foil sheet of FIG. 1 and the adhesive sheet of FIG. 2.

FIG. 4 shows step 3, in which the adhesive sheet 120 is adhered between the substrate layer 112 and the copper foil sheet 130, thereby obtaining a multilayer substrate 100a.

After adhering, the first opening 121 spatially corresponds to the removable area 131, and a portion of the substrate layer 112, which is in the removable area 131, is covered by the removable area 131 of the copper foil sheet 130.

FIGS. 5 to 8 show step 4, in which at least one electrically conductive hole 104 is formed in the multilayer substrate 100a. In the embodiment, there is one electrically conductive hole 104 shown in the FIG. 8. It is understood that there may be two electrically conductive holes 104, or any number of electrically conductive holes 104.

Figure 5:
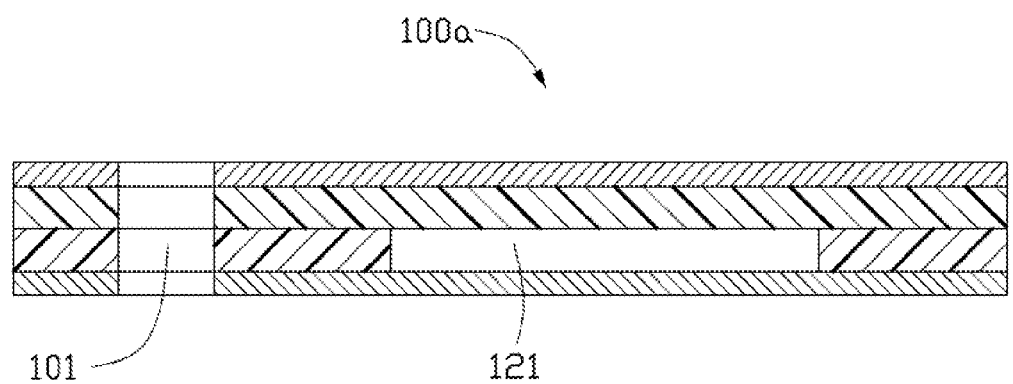
FIG. 5 shows a through hole defined in the multilayer substrate of FIG. 4.

First, as FIG. 5 shows, a through hole 101 is defined in the multilayer substrate 100a. In the present embodiment, there may be one, two, or any number of through holes. The through hole 101 passes through the multilayer substrate 100a. The through hole 101 is defined in the circuit area 132 of the copper foil sheet 130, and is separated from the first opening 121. That is, the through hole 101 is not in the single layer circuit area 100b of the printed circuit board 100. The through hole 101 passes through the copper foil substrate 110, the adhesive sheet 120, and the copper foil sheet 130.

Figure 6:
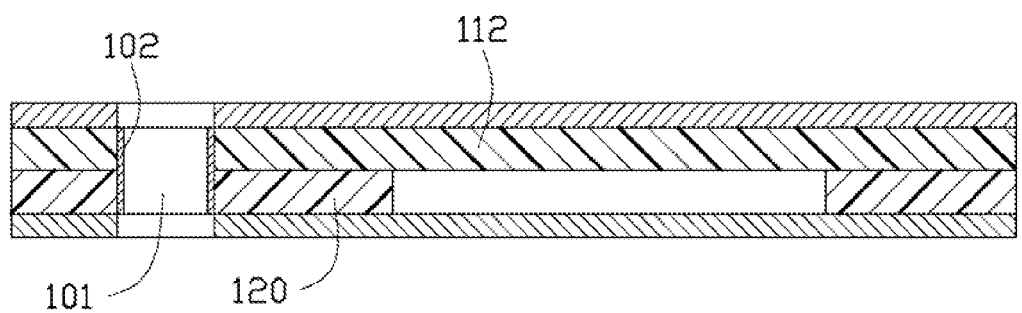
FIG. 6 shows an electrically conductive layer formed in the inner wall of the through hole of FIG. 5.

Second, as FIG. 6 shows, an electrically conductive layer 102 is formed on a portion of the substrate layer 112 and a portion of the adhesive sheet 120, which are exposed in the through hole 101. In the present embodiment, the electrically conductive layer 102 is formed by a black oxide treatment or a discolor hole method. A material of the electrically conductive layer 102 may be powdered carbon.

Figure 7:
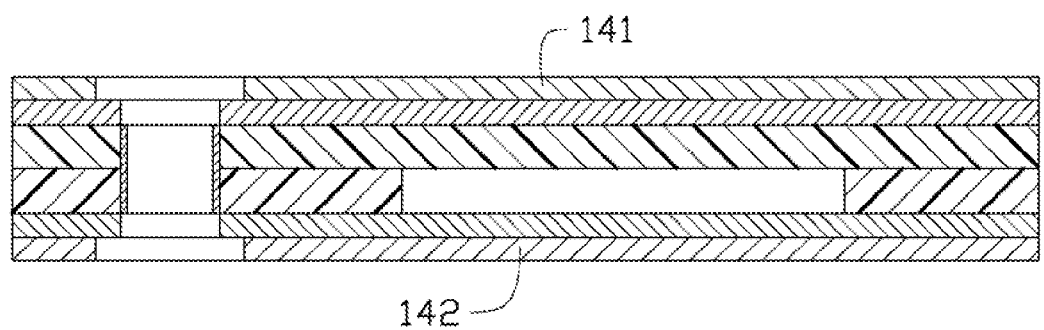
FIG. 7 shows a photoresist layer formed on the multilayer substrate of FIG. 6.

Third, as FIG. 7 shows, a first photoresist pattern 141 is formed on the surface of the copper foil layer 111, and a second photoresist pattern 142 is formed on the surface of the copper foil sheet 130.

The first photoresist pattern 141 and the second photoresist pattern 142 may be formed by arranging a dry photoresist film on the surface of the copper foil layer 111, exposing the dry photoresist film, and developing the dry photoresist film. A portion of the copper foil layer 111 surrounding the through hole 101 is exposed from the first photoresist pattern 141, and the other portion of the copper foil layer 111 is covered by the first photoresist pattern 141. A portion of the copper foil sheet 130, which surrounds the through hole 101, is exposed from the second photoresist pattern 142, and the other portion of the copper foil sheet 130, which is further from the through hole 101, is covered by the second photoresist pattern 142.

Figure 8:
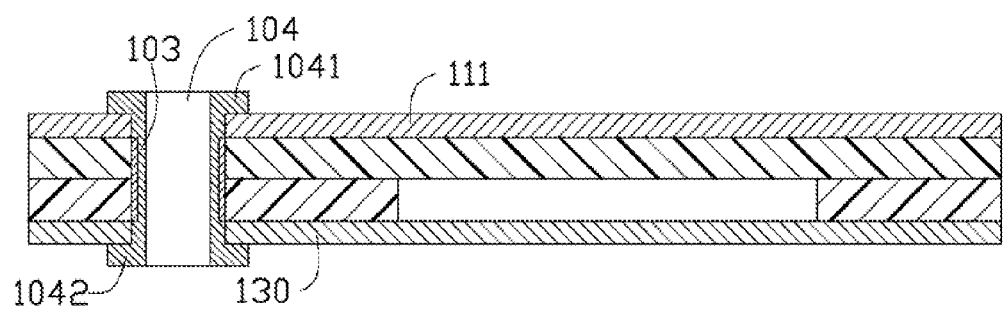
FIG. 8 shows an electrically conductive hole defined in the multilayer substrate of FIG. 7.

Fourth, as FIG. 8 shows, an electroplating copper layer 103 is formed on the inner sidewall of the through hole 101, the surface of the copper foil layer 111, which is exposed from the first photoresist pattern 141, and the surface of the copper foil sheet 130, which is exposed from the second photoresist pattern 142, thereby obtaining the electrically conductive hole 104. In the present embodiment, the electroplating copper layer 103 is formed by an electroplating process. A portion of the electroplating copper layer 103, which is formed on the surface of the copper foil layer 111 exposed from the first photoresist pattern 141, is a first annular ring 1041. A portion of the electroplating copper layer 103, which is formed on the surface of the copper foil sheet 130 exposed from the second photoresist pattern 142, is a first annular ring 1042. Finally, the first photoresist pattern 141 and the second photoresist pattern 142 are removed from the multilayer layer 100a. In the present embodiment, the first photoresist pattern 141 and the second photoresist pattern 142 are removed by using a stripping solution.

Figure 9:
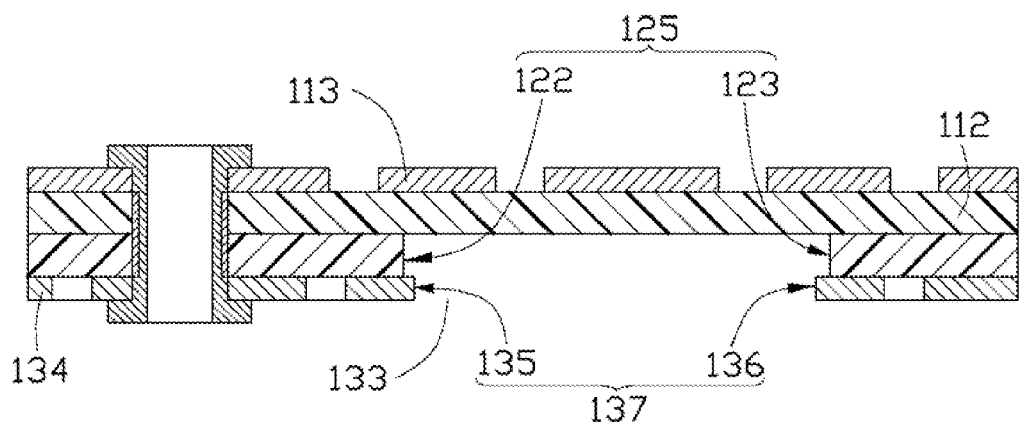
FIG. 9 shows electrically conductive circuit traces converted by the copper foil layer of copper foil substrate and the copper foil sheet of FIG. 8.

FIG. 9 shows step 5, in which the copper foil layer 111 is converted into a first electrically conductive circuit pattern 113 by selectively etching, and the removal area 131 is removed by etching to form a second opening 133. The copper foil sheet 130 is converted into a second electrically conductive circuit pattern 134 by selectively etching. A portion of the substrate layer 121 and a portion of the first electrically conductive circuit pattern 113, both of which spatially correspond the first opening 121, cooperatively constitute the single layer circuit area 100b.

In the present embodiment, the first electrically conductive circuit pattern 113, the second electrically conductive circuit pattern 134, and the second opening 133 are formed by an image transfer process and an etching process. A shape of the second opening 133 substantially corresponds to the shape of the first opening 121, and a size of the second opening 133 is substantially corresponds to the size of the first opening 121. Because the first opening 121 is formed by a stamping method, and the second opening 133 is formed by an image transfer process and an etching process, the first opening 121 and the second opening 133 are not parallel and level. That is, an orthogonal projection of the first opening 121 on the substrate layer 112 at least partially overlaps but not completely overlap an orthogonal projection of the second opening 133 on the substrate layer 112. The orthogonal projection of the first opening 121 on the substrate layer 112 may be within the orthogonal projection of the second opening 133 on the substrate layer 112; or the orthogonal projection of the second opening 133 on the substrate layer 112 may be within the orthogonal projection of the first opening 121 on the substrate layer 112; or the orthogonal projection of the first opening 121 on the substrate layer 112 may intersect the orthogonal projection of the second opening 133 on the substrate layer 112. That is, the shape of the first opening 121 may be identical to the shape of the second opening 133; the size of the first opening 121 may be slightly smaller or larger than the size of the second opening 133, or the size of the first opening 121 may be identical to the size of the second opening 133; but the first opening 121 deviates from the second opening 133.

In the present embodiment, in the position of the second opening 133, the second electrically conductive circuit pattern 134 includes a second inner sidewall 137 surrounding the second opening 133. The second inner sidewall 137 includes a fifth side surface 135, a sixth side surface (not shown), a seventh side surface 136, and a eighth side surface (not shown), which are connected end to end. The fifth side surface 135 corresponds to the first side surface 122; the sixth side surface corresponds to the second side surface; the seventh side surface 136 corresponds to the third side surface 123; the eighth side surface corresponds to the fourth side surface. In the above described four groups of the corresponding side surfaces, at least one group of the corresponding side surfaces are not in a same plane. In other words, the first inner sidewall 125 and the second inner sidewall 137 are generally but not completely coplanar with each other. That is, an orthogonal projection of the first inner sidewall 125 on the substrate layer 112 at lease partially overlaps but not completely overlap an orthogonal projection of the second inner sidewall 137 on the substrate layer 112.

Figure 10:
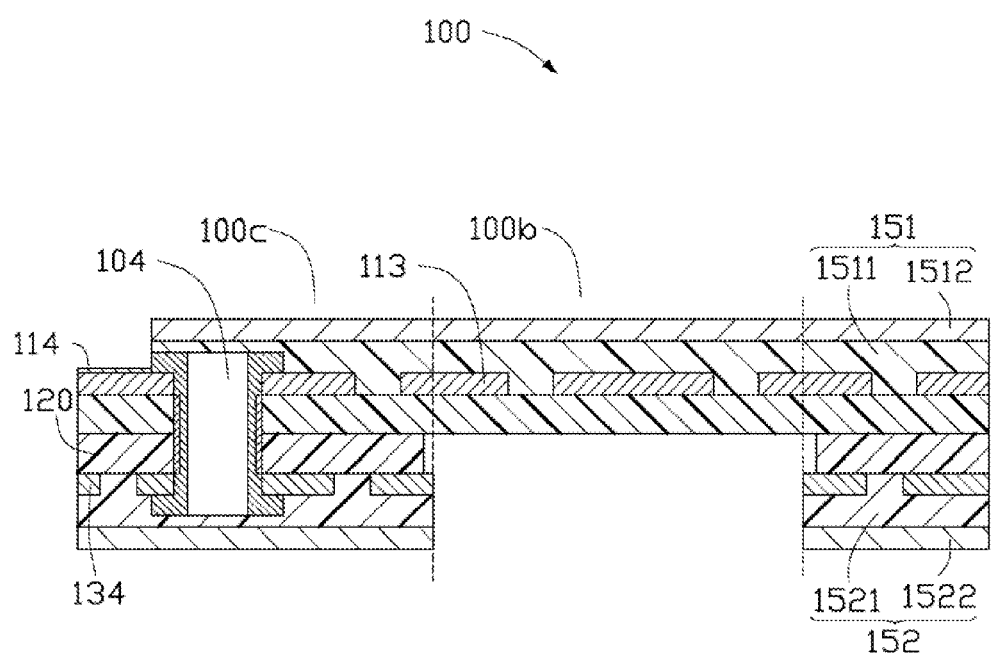
FIG. 10 is a cross-sectional view of a first printed circuit board, the printed circuit board comprises a first inner sidewall and a second inner sidewall.

FIG. 10 shows step 6, in which a first cover layer 151 is formed on a surface of a portion of the first electrically conductive circuit pattern 113; a second cover layer 152 is formed on a surface of the second electrically conductive circuit pattern 134 and a surface of the adhesive sheet 120 exposed from the second electrically conductive circuit pattern 134.

In the present embodiment, a cover layer film 1512 with an adhesive layer 1511 is adhered to the surface of a portion of the first electrically conductive circuit pattern 113 and a surface of the substrate layer 112 exposed from the first electrically conductive circuit pattern 113, thereby obtaining the first cover layer 151. Meanwhile, a cover layer film 1522 with the adhesive layer 1521 is adhered to the surface of the second electrically conductive circuit pattern 134 and the surface of the adhesive sheet 120 exposed from the second electrically conductive circuit pattern 134, thereby obtaining the second cover layer 152.

Step 7, in which a surface treatment is processed on the surface of the portion of the first electrically conductive circuit pattern 113 exposed from the first cover layer 151. In the present embodiment, a nickel gold layer 114 (see FIG. 10) is formed on the surface of the portion of the first electrically conductive circuit pattern 113 exposed from the first cover layer 151. The nickel gold layer 114 is configured for protecting the portion of the first electrically conductive circuit pattern 113, and includes a nickel layer contacting with the first electrically conductive circuit pattern 113 and a gold layer formed on the nickel layer.

FIGS. 10 to 15, a circuit board 100 manufactured by the above method is provided. The circuit board 100 includes the first electrically conductive circuit pattern 113, the substrate layer 112, the adhesive sheet 120, and the second electrically conductive circuit pattern 134, which are arranged in the above described order. The circuit board 100 includes a single layer circuit area 100b and a double layer circuit area 100c surrounding the single layer circuit area 100b. In the single layer circuit area 100b, there is only one electrically conductive circuit pattern. In the double layer electrically conductive circuit area 100c, there are two electrically conductive circuit patterns. The first opening 121 spatially corresponding to the single layer circuit area 100b is defined in the adhesive sheet 120. The second opening 133 spatially corresponding to the single layer circuit area 100b is defined in the second electrically conductive circuit pattern 134. The orthogonal projection of the first opening 121 on the substrate layer 112 intersects the orthogonal projection of the second opening 133 on the substrate layer 112. That is, the size of the first opening 121 may be slightly smaller or larger than the size of the second opening 133, or the size of the first opening 121 may be identical to the size of the second opening 133; but the first opening 121 deviates from the second opening 133.

In the present embodiment, the adhesive sheet 120 includes the first inner sidewall 125 surrounding the first opening 121. The first inner sidewall 125 includes the first side surface 122, the second side surface, the third side surface 123, and the fourth side surface (not shown). In the position of the second opening 133, the second electrically conductive circuit pattern 134 includes the second inner sidewall 137. The second inner sidewall 137 includes the fifth side surface 135, the sixth side surface, the seventh side surface 136, and the eighth side surface, which are connected end to end. The fifth side surface 135 corresponds to the first side surface 122; the sixth side surface corresponds to the second side surface; the seventh side surface 136 corresponds to the third side surface 123; the eighth side surface corresponds to the fourth side surface. In the above described four groups of the corresponding side surfaces, at least one group of the corresponding side surfaces are not in a same plane. That is, an orthogonal projection of the first inner sidewall 125 on the substrate layer 112 at least partially overlaps but not completely overlap a orthogonal projection of the second inner sidewall 137 on the substrate layer 112.

Figure 11:
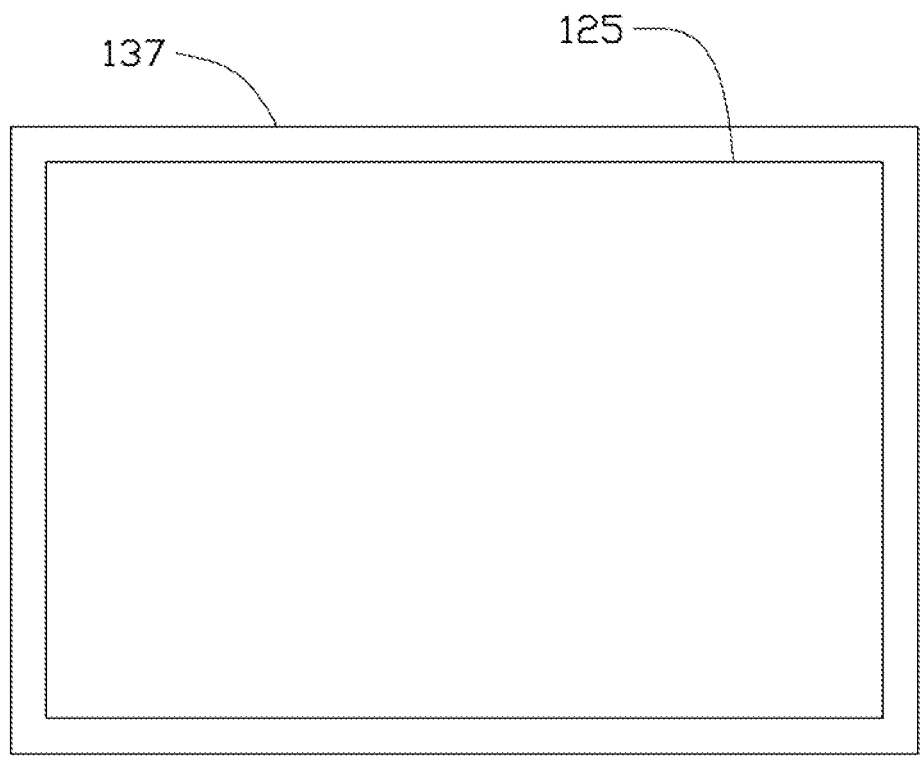
FIG. 11 shows a position relationship of a orthogonal projection of the first inner sidewall on the substrate layer and a orthogonal projection of the second inner sidewall on the substrate layer of FIG. 10.

In detail, as FIGS. 10 and 11 show, when a cross section of the first opening 121 is smaller than a cross section of the second opening 133, the orthogonal projection of the first opening 121 on the substrate layer 112 is in the orthogonal projection of the second opening 133 on the substrate layer 112. The orthogonal projection of the second inner sidewall 137 on the substrate layer 112 surrounds the orthogonal projection of the first inner sidewall 125 on the substrate layer 112.

Figure 12:
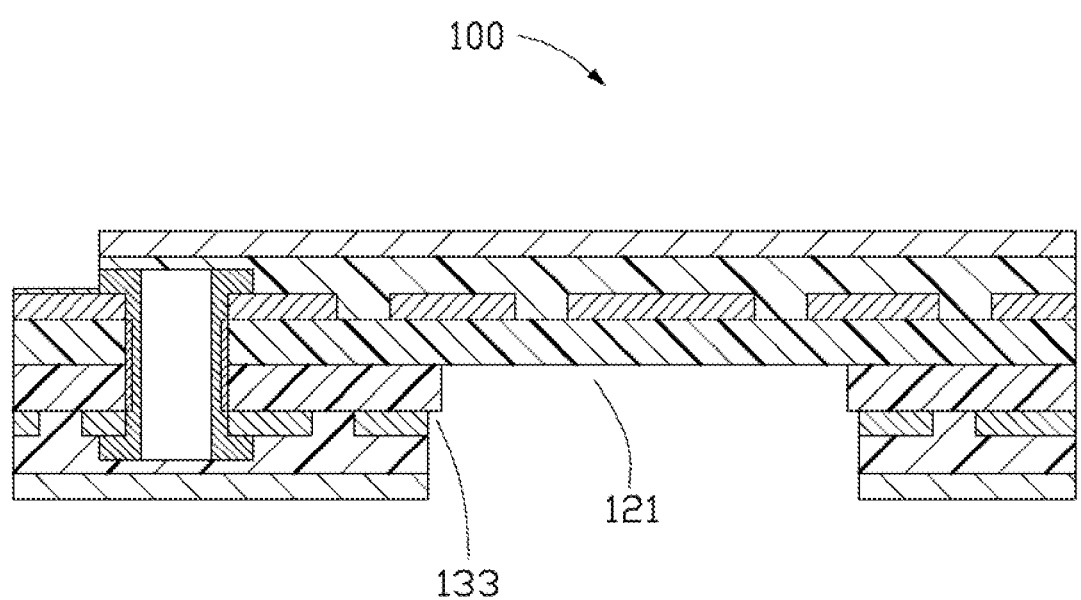
FIG. 12 is a cross-section view of a second printed circuit board.
Figure 13:
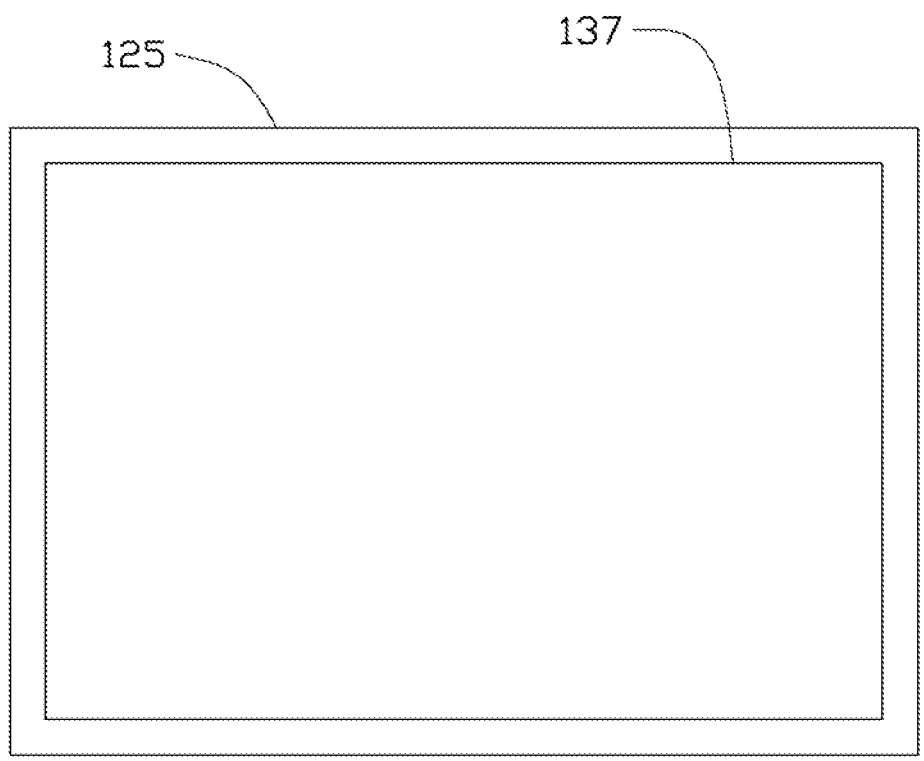
FIG. 13 shows a position relationship of a orthogonal projection of the first inner sidewall on the substrate layer and a orthogonal projection of the second inner sidewall on the substrate layer of FIG. 12.

As FIGS. 12 and 13 show, when the cross section of the first opening 121 is larger than the cross section of the second opening 133, the orthogonal projection of the second inner sidewall 137 on the substrate layer 112 is within the orthogonal projection of the first inner sidewall 125 on the substrate layer 112.

Figure 14:
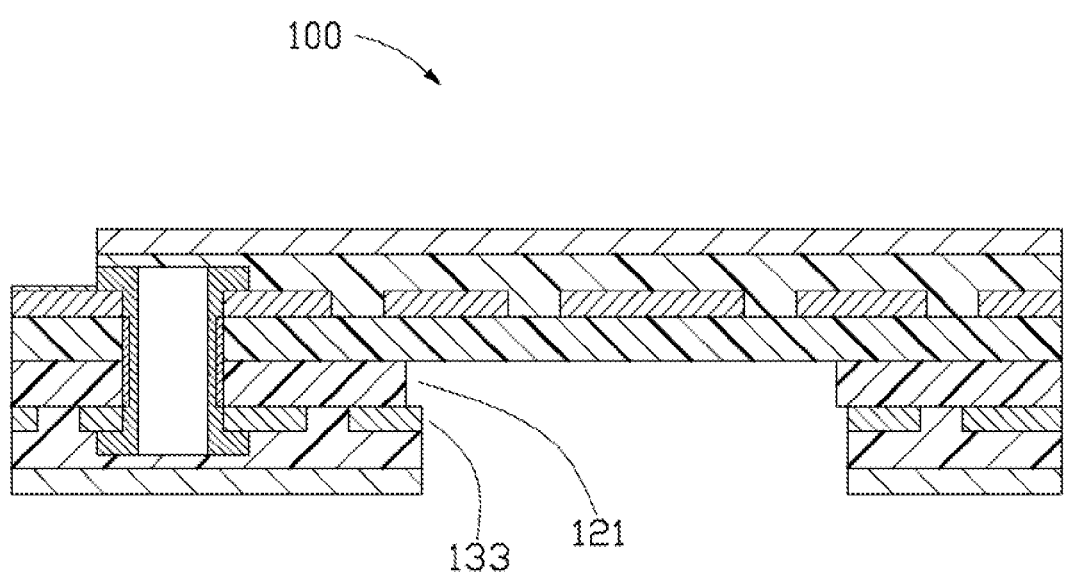
FIG. 14 is a cross-section view of a third printed circuit board.
Figure 15:
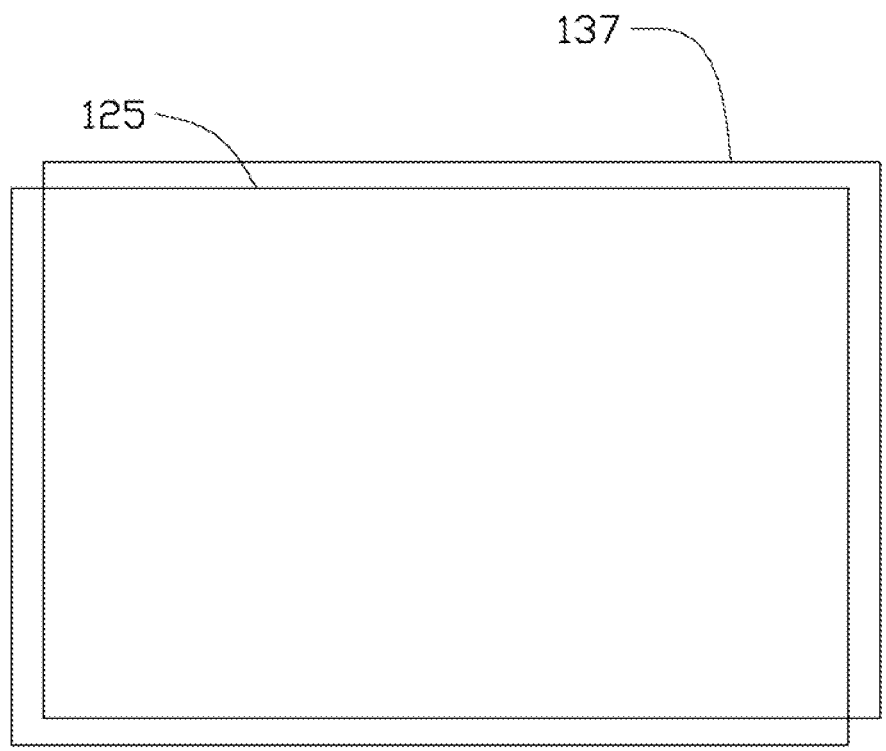
FIG. 15 shows a position relationship of a orthogonal projection of the first inner sidewall on the substrate layer and a orthogonal projection of the second inner sidewall on the substrate layer of FIG. 14.

As FIGS. 14 and 15 show, when the cross section of the first opening 121 is equal to the cross section of the second opening 133, the second opening 133 deviates from the first opening 121. The orthogonal projection of the first opening 121 on the substrate layer 112 partially overlaps but not completely overlaps the orthogonal projection of the second opening 133 on the substrate 112. That is, the orthogonal projection of the first opening 121 on the substrate layer 112 intersects the orthogonal projection of the second opening 137.

In the printed circuit board 100, the electrically conductive hole 104 is formed. The electrically conductive hole 104 is configured for electrically connecting the first electrically conductive circuit pattern 113 and the second electrically conductive circuit pattern 134.

The printed circuit board 100 also includes the first cover layer 151 and the second cover layer 152. The first cover layer 151 is formed on the surface of the portion of the electrically conductive circuit pattern 113. The second cover layer 152 is formed on the second electrically conductive circuit pattern 134 and the surface of the adhesive sheet 120 exposed from the second electrically conductive circuit pattern 134.

The printed circuit board 100 also includes the nickel gold layer 114. The nickel gold layer 114 is formed on the surface of the first electrically conductive circuit pattern 113 exposed from the first cover layer 151. The nickel gold layer 114 is configured for protecting the portion of the first electrically conductive circuit pattern 113, and includes a nickel layer contacting with the first electrically conductive circuit pattern 113 and a gold layer formed on the nickel layer.

In the method for manufacturing the printed circuit board, before laminating, there is only a first opening defined in the adhesive sheet, and the copper foil layer does not define an opening. Therefore, in the method for manufacturing the printed circuit board, the copper foil layer can cover the substrate layer, such that the substrate layer cannot absorb electrically material, and the electroplating copper layer cannot be formed on the substrate layer in an electroplating process. Accordingly, the damage to the electroplating copper layer can be avoided, and the substrate layer can be easily dried. Therefore, electrically conductive circuit traces adjacent to the single layer circuit area is hardly oxidized, and a productivity of the PCB is higher.

While certain embodiments have been described and exemplified above, various other embodiments will be apparent from the foregoing disclosure to those skilled in the art. The disclosure is not limited to the particular embodiments described and exemplified but is capable of considerable variation and modification without departure from the scope and spirit of the appended claims.

What is claimed is:

1. A method for manufacturing a printed circuit board, comprising:

providing a single side copper clad laminate, an adhesive sheet, and a copper foil sheet, the single side copper clad laminate comprising a copper foil layer and a substrate layer, the copper foil sheet comprising a removable area and a circuit area surrounding the removable area;

defining a first opening in the adhesive sheet, the adhesive sheet comprising a first inner sidewall surrounding the first opening;

jointing the adhesive sheet between the substrate layer of the single side copper clad laminate and the copper foil sheet, thereby obtaining a multilayer substrate, the first opening spatially corresponding to the removable area; and converting the copper foil layer into a first electrically conductive circuit pattern by etching, removing the removable area off the copper foil sheet by etching to obtain a second opening, converting the circuit area of the copper foil sheet into a second electrically conductive circuit pattern by etching, the second electrically conductive circuit pattern comprising a second inner sidewall surrounding the second opening, the first inner sidewall and the second inner sidewall being generally but not completely coplanar.

2. The method of claim 1, wherein after the step of jointing the adhesive sheet between the substrate layer of the single side copper clad laminate and the copper foil sheet, and before the step of converting the copper foil layer into a first electrically conductive circuit pattern by etching, the method further comprises a step of forming at least one electrically conductive hole in the multilayer substrate for electrically connecting the copper foil layer and the copper foil sheet.

3. The method of claim 1 wherein after the step of converting the copper foil layer into a first electrically conductive circuit pattern by selectively etching, the method further comprises a step of forming a first cover layer on the first electrically conductive circuit pattern and forming a second cover layer on the second electrically conductive circuit pattern, a portion of the first electrically conductive circuit pattern being exposed from the first cover layer.

4. The method of claim 3, wherein after forming a first cover layer on the first electrically conductive circuit pattern and forming a second cover layer on the second electrically conductive circuit pattern, the method further comprises a step of forming a nickel gold layer on the portion of the first electrically conductive circuit pattern, which is exposed from the first cover layer.

\* \* \* \* \*